(12) United States Patent
Paik et al.

(10) Patent No.: US 11,021,616 B2
(45) Date of Patent: Jun. 1, 2021

(54) SELF-EXPOSURE METHOD FOR SURFACE OF CONDUCTIVE PARTICLES ANCHORED IN POLYMER LAYER, METHOD OF FABRICATING ANISOTROPIC CONDUCTIVE FILM USING THE SELF-EXPOSURE METHOD AND THE ANISOTROPIC CONDUCTIVE FILM

(71) Applicant: Korea Advanced Institute of Science and Technology, Daejeon (KR)

(72) Inventors: KyoungWook Paik, Daejeon (KR); Dal Jin Yoon, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 178 days.

(21) Appl. No.: 16/057,582

(22) Filed: Aug. 7, 2018

(65) Prior Publication Data
US 2019/0225819 A1 Jul. 25, 2019

(30) Foreign Application Priority Data
Jan. 25, 2018 (KR) .......................... 10-2018-0009182

(51) Int. Cl.
*C09D 5/24* (2006.01)
*B05D 1/28* (2006.01)
(Continued)

(52) U.S. Cl.
CPC ................. *C09D 5/24* (2013.01); *B05D 1/28* (2013.01); *C08K 9/04* (2013.01); *C09D 133/20* (2013.01);
(Continued)

(58) Field of Classification Search
CPC ......... C09D 5/24; C09D 133/20; H01L 21/00; C08K 9/04; C08K 2201/001; C09J 7/22;
(Continued)

(56) References Cited

U.S. PATENT DOCUMENTS 5,063,128 A * 11/1991 Yuh ........................ G03G 5/104
430/131
5,075,039 A * 12/1991 Goldberg ................. H01B 1/20
252/519.34
(Continued)

FOREIGN PATENT DOCUMENTS

JP     2013105537      5/2013
KR  10-2011-0090332   8/2011
(Continued)

OTHER PUBLICATIONS

KR-20160128536 machine translation of description and claims (GOOGLE) (Year: 2020).*
(Continued)

*Primary Examiner* — Christopher T Schatz
*Assistant Examiner* — Cynthia L Schaller
(74) *Attorney, Agent, or Firm* — - Blank Rome LLP

(57) ABSTRACT

Disclosed are a self-exposure method for a surface of conductive particles anchored in a polymer layer, a method of fabricating an anisotropic conductive film using the self-exposure method, and the anisotropic conductive film. A self-exposure method for a surface of conductive particles within a polymer layer may include controlling surface energy of multiple conductive particles so that a difference between surface energy of polymer to be used to fabricate the polymer layer and surface energy of the multiple conductive particles to be included in the polymer layer is a preset difference or more, forming a polymer solution by dissolving the polymer into a solvent in which the conduc-
(Continued)

tive particles having controlled surface energy have been mixed, and generating the polymer layer from which at least part of a surface of the multiple conductive particles has been externally exposed due to a difference in the surface energy by drying the polymer solution.

9 Claims, 17 Drawing Sheets

(51) Int. Cl.
    *C09D 133/20*     (2006.01)
    *C09J 9/02*     (2006.01)
    *C09J 7/24*     (2018.01)
    *H01L 21/00*     (2006.01)
    *C08K 9/04*     (2006.01)
    *C09J 7/22*     (2018.01)
    *H01B 1/20*     (2006.01)

(52) U.S. Cl.
    CPC . *C09J 7/22* (2018.01); *C09J 7/24* (2018.01); *C09J 9/02* (2013.01); *H01L 21/00* (2013.01); *C08K 2201/001* (2013.01); *C09J 2203/326* (2013.01); *C09J 2301/314* (2020.08); *C09J 2301/41* (2020.08); *H01B 1/20* (2013.01)

(58) Field of Classification Search
CPC . C09J 9/02; C09J 7/24; C09J 2203/326; C09J 2205/106; C09J 2201/602; B05D 1/28; H01B 1/20

See application file for complete search history.

(56) References Cited

U.S. PATENT DOCUMENTS

2011/0303885 A1* 12/2011 Vanheusden ............. H01B 1/02
    252/513
2017/0174914 A1* 6/2017 Matsumura ........... H01L 21/288

FOREIGN PATENT DOCUMENTS

KR     10-2012-0028583 A     3/2012
KR     20160128536     * 11/2016

OTHER PUBLICATIONS

Seo et al., "The Preparation of Hydrophobic Silver Nanoparticles Via Solvent Exchange Method," Science Direct, Colloids and Surfaces A: Physicochem. Eng. Aspects 313-314 (2008) 158-161. (Year: 2007).*

Lee et al., Plasma-etched Nanofiber Anisotropic Conductive Films (ACFs) for Ultra Fine Pitch Interconnection, Electronic Components & Technology Conference, 2015, pp. 142-145.

* cited by examiner (a)

(b)

(a)

(b)

(a)

(b)

(a)

(b)

SELF-EXPOSURE METHOD FOR SURFACE OF CONDUCTIVE PARTICLES ANCHORED IN POLYMER LAYER, METHOD OF FABRICATING ANISOTROPIC CONDUCTIVE FILM USING THE SELF-EXPOSURE METHOD AND THE ANISOTROPIC CONDUCTIVE FILM

CROSS REFERENCE TO RELATED APPLICATION

The present application claims the benefit of Korean Patent Application No. 10-2018-0009182 filed in the Korean Intellectual Property Office on Jan. 25, 2018, the entire contents of which are incorporated herein by reference.

BACKGROUND OF THE INVENTION

1. Technical Field

The following embodiments relate to a self-exposure method for a surface of conductive particles anchored in a polymer layer, a method of fabricating an anisotropic conductive film using the self-exposure method, and the anisotropic conductive film.

2. Description of the Related Art

Adhesives used upon electron packaging are classified into a film form and a paste form depending on its use type and are classified into conductive adhesives, anisotropic conductive adhesives, and non-conductive adhesives depending on whether they include conductive particles. In general, the adhesives are classified into an anisotropic conductive film (ACF), anisotropic conductive paste (ACP), a non-conductive film (NCF) and non-conductive paste (NCP).

Particularly, a next-generation ultra-fine pitch display technology commonly uses the ACF containing conductive particles because it requires high resolution and electrical stability. A bonding method between electronic parts using the ACF is a process of substituting the existing soldering process (i.e., a lead-free process). The bonding method has advantages in that it has a simple process and is eco-friendly, it is more stable thermally because it is not necessary to apply an instant high temperature to a product (i.e., a low temperature process), it can reduce a process cost using a glass substrate or a cheap substrate such as polyester flex, and it can implement an ultra-fine electrode pitch (may be simply called an "ultra-fine pitch") because electrical bonding is performed using fine conductive particles.

Owing to such advantages, the utilization of the adhesives (i.e., ACF and NCF) of a film form is gradually extended to display packaging for a smart card, a liquid crystal display (LCD), a plasma display panel (PDP) and organic light-emitting diodes (OLEDs) and packaging for computers, mobile phones and communication systems.

Recently, in the products of the electronic device market, the number of I/Os of parts is increased because the products require high performance and multiple functions. Accordingly, fine pitching or ultra-fine pitching in which the interval between electrodes becomes fine is indispensable. However, the greatest problem in such fine pitch packaging is electrical bonding problem occurring due to a narrowed gap between bumps and electrodes.

Specifically, in the case of electrical bonding using the ACF, a flow of the conductive particles occurs due to a flow of thermosetting polymer resin upon thermal compression. A large amount of conductive particles must be used to prevent an open or high resistance bonding problem because conductive particles are not captured or are less captured between bumps and electrodes.

Accordingly, a short phenomenon, that is, an electrical error in which a large amount of conductive particles flowing along with polymer are caught between the bumps or between the electrodes to make the electrodes horizontally conductive. In particular, the fine pitching of a display product is rapidly performed, thereby worsening the problem.

FIG. 1 is a diagram for illustrating a conventional ACF for electrical bonding having two electrodes. More specifically, FIG. 1a shows the state before the bonding of an ACF for a conventional electrical bonding having two electrodes. FIG. 1b shows the state after the bonding of the ACF for a conventional electrical bonding having the two electrodes.

Referring to FIG. 1, in the bonding process between the two electrodes of substrates 20 and 21 at the top and bottom using the ACF 10, a flow of polymer resin occurs, a wide gap between bumps is filled with the polymer resin, and curing is performed in order to implement a vertically stable electrical bonding and to maintain the insulating state horizontally. In this case, the ACF 10 may include a polymer layer 11 including conductive particles and an adhesive layer 12.

However, as the ultra-fine pitch electrical bonding technology is developed, the space between bumps and between electrodes is narrowed and the width of each bump and electrode tends to be significantly reduced. If the conventional ACF 10 is used for such ultra-fine pitch bonding, problems, such as an electrical short phenomenon and an unstable contact state, occur.

FIG. 2 is a diagram for illustrating an electrical short phenomenon and an unstable contact state occurring in conventional ultra-fine pitch bonding. More specifically FIG. 2a shows the state before the bonding of an ACF for a conventional electrical bonding having two electrodes of an ultra-fine pitch, and FIG. 2b shows the state after the bonding of the ACF for a conventional electrical bonding having the two electrodes of ultra-fine pitch.

As shown in FIG. 2, in the bonding process, the conventional ACF 10 does not suppress a flow of the conductive particles attributable to a flow of resin, an aggregation phenomenon of the conductive particles occurs between the narrowed bumps or electrodes of substrates 20 and 21 at the top and bottom. Accordingly, an electrical short circuit occurs, and bonding becomes unstable due to a loss of lost of conductive particles.

Korean Patent Application Publication No. 10-2012-0028583 relates to conductive polymer adhesives using a nano fiber and describes a technology regarding a nano fiber ACF device including a nano fiber layer that suppresses a movement of conductive balls by inserting the conductive balls (or conductive particles) into the nano fiber.

However, the nano fiber ACF has a problem in that productivity is low compared to the existing ACF process because it requires an additional bonding process called a resin flow in order to increase a capturing ratio per bump of conductive balls.

In the case of an ACF for a fine pitch used a lot for electrical bonding, the ACF product of Japan using insulating coating conductive particles and a dual layer has monopolized the world's ACF market. However, there is a need for the development of an ACF technology of a new concept for fine pitch bonding because a bonding failure frequently occurs in the fine pitch.

SUMMARY OF THE INVENTION

Embodiments of the present invention provide a technology for a self-exposure method capable of self-exposing at least part of a surface of conductive particles as polymer runs down along the surface of the conductive particles by controlling surface energy of the conductive particles in a process of fabricating a polymer layer including the conductive particles.

Embodiments of the present invention provide a technology regarding a method of fabricating an anisotropic conductive film using the self-exposure and an anisotropic conductive film fabricated by the fabrication method.

There is provided a self-exposure method for a surface of conductive particles within a polymer layer, including controlling surface energy of multiple conductive particles so that a difference between surface energy of polymer to be used to fabricate the polymer layer and surface energy of the multiple conductive particles to be included in the polymer layer is a preset difference or more, forming a polymer solution by dissolving the polymer into a solvent in which the conductive particles having controlled surface energy have been mixed, and generating the polymer layer from which at least part of a surface of the multiple conductive particles has been externally exposed due to a difference in the surface energy by drying the polymer solution.

In accordance with an aspect, controlling the surface energy may include controlling the surface energy of the conductive particles by coating a hydrophobic substance on the surface of the conductive particles if the polymer has a hydrophilic property or coating a hydrophilic substance on the surface of the conductive particles if the polymer has a hydrophobic property.

In accordance with another aspect, controlling the surface energy may include stirring a hydrophobic substance if the polymer has a hydrophilic property or a hydrophilic substance if the polymer has a hydrophobic property by dissolving the substance into the solvent in which the multiple conductive particles have been mixed so that the substance is coated on the surface of the conductive particles.

In accordance with yet another aspect, controlling the surface energy may include controlling a degree that the surface energy of the conductive particles is changed by adjusting content of the hydrophobic substance dissolved into the solvent in which the multiple conductive particles have been mixed or content of the hydrophilic substance dissolved into the solvent.

In accordance with yet another aspect, the hydrophobic substance or hydrophilic substance coated on the surface of the conductive particles may have conductivity.

In accordance with yet another aspect, the polymer includes polyacrylonitrile having a hydrophilic property. Controlling the surface energy may include controlling the surface energy of the conductive particles by coating oleic acid on the surface of the conductive particles in order to assign a hydrophobic property.

In accordance with yet another aspect, controlling the surface energy may include controlling the surface energy of the conductive particles by coating oleic acid having content of 20 wt % or more with respect to the polymer solution on the surface of the conductive particles in such a way as to stir the oleic acid by dissolving the oleic acid into the solvent in which the multiple conductive particles have been mixed.

In accordance with yet another aspect, the self-exposure method may further include fabricating an anisotropic conductive film (ACF) by laminating an adhesive layer made of a non-conductive film (NCF) at a top and bottom of the polymer layer.

In accordance with yet another aspect, the polymer layer may include polymer having tensile stress to limit a flow of the multiple conductive particles when the polymer layer connects the multiple conductive particles and a flow of resin occurs due to a bonding process.

In accordance with yet another aspect, generating the polymer layer may include fabricating the polymer layer to limit a flow of the conductive particles by roll-to-roll-coating the polymer solution.

There is provided an anisotropic conductive film (ACF) including multiple conductive particles, including a polymer layer in which the multiple conductive particles have been distributed so that at least part of a surface of the multiple conductive particles is exposed to an outside of the polymer layer, wherein the at least part of the surface of the multiple conductive particles is self-exposed due to a difference between surface energy of polymer forming the polymer layer and surface energy of the conductive particles.

DETAILED DESCRIPTION

Figure 1:
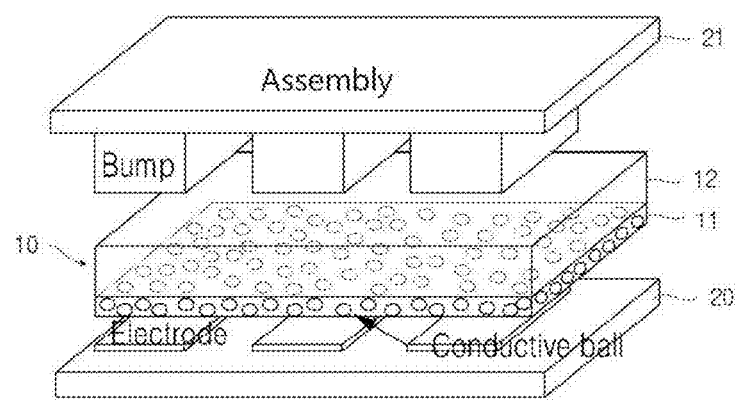
FIG. 1 is a diagram for illustrating an ACF for a conventional electrical bonding having two electrodes.
Figure 1:
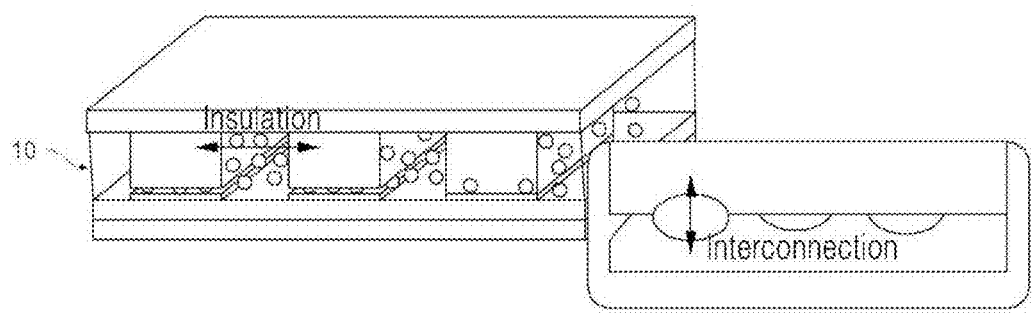
Figure 2:
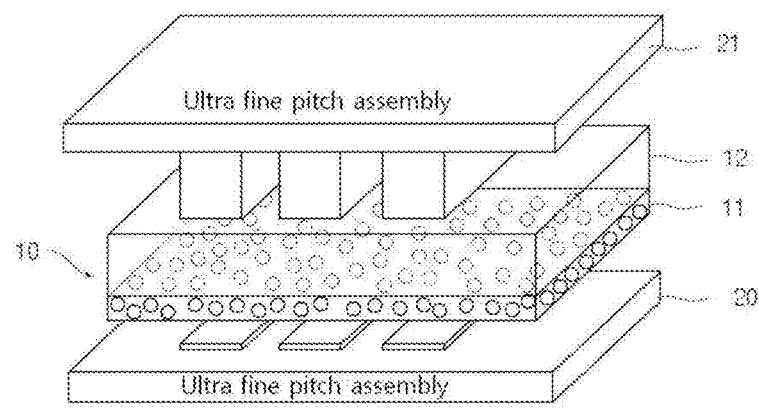
FIG. 2 is a diagram for illustrating an electrical short phenomenon and an unstable contact state occurring in conventional ultra-fine pitch bonding.
Figure 2:
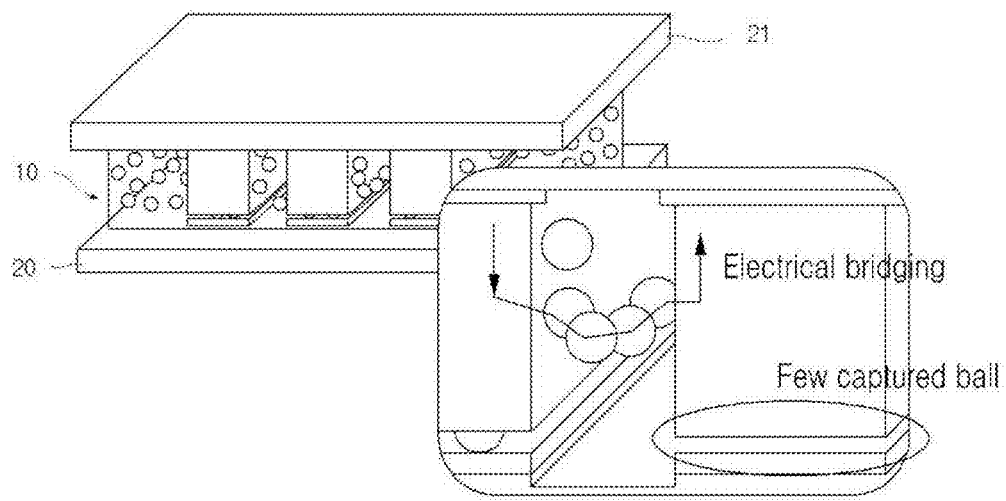

Hereinafter, embodiments of the present invention are described in detail with reference to the accompanying drawings. However, the described embodiments may be modified in other various forms, and the scope of the present invention is not restricted by the following embodiments. Furthermore, the embodiments of the present invention are intended to fully describe the present invention to a person having ordinary knowledge in the art to which the present invention pertains. In the drawings, the shapes, sizes, etc. of components in the drawings may be exaggerated to make the description clear.

The following embodiments can secure an excellent electrical bonding characteristic by providing a new anisotropic conductive film (ACF) including an anchoring polymer layer (APL) that suppresses a flow of conductive particles. In this case, the anchoring APL may mean a polymer layer that limits a flow of conductive particles. A new ACF including an anchoring APL may be expressed as an ACF including a polymer layer that limits a flow of conductive particles (it may be hereinafter simply referred to as an "APL ACF"). The ACF including the polymer layer that limits a flow of conductive particles may be performed by dispersing the conductive particles into the anchoring APL having excellent tensile strength and performing a lamination or dual coating method on polymer adhesive layers of a non-conductive film (NCF), that is, upper and lower insulating films.

A flow of the conductive particles can be certainly reduced using the ACF including the polymer layer that limits a flow of conductive particles (APL ACF) although the conductive particles are connected using polymer having strong tensile stress and a flow of resin occurs.

Furthermore, embodiments regarding a new method capable of self-exposing a surface of conductive particles even without the introduction of a separate process for removing a polymer skin that surrounds the conductive particles are further provided.

Figure 3:
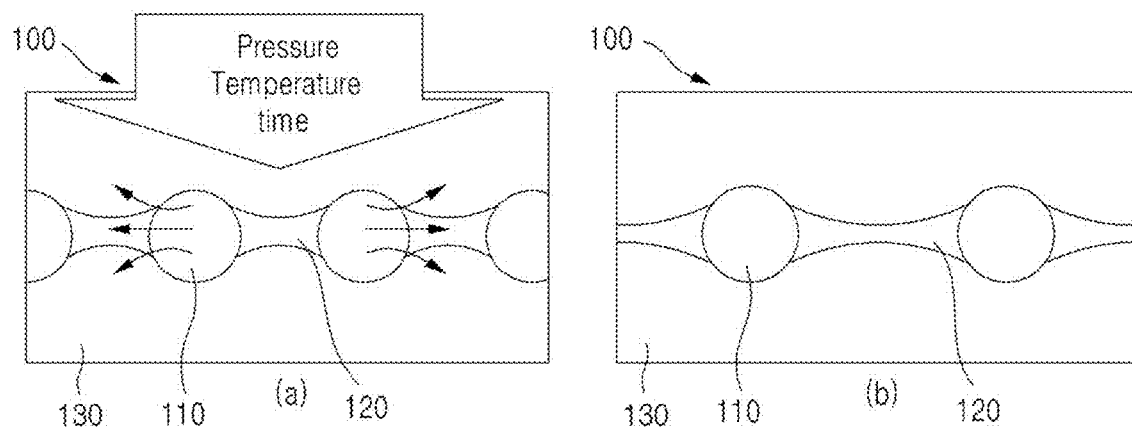
FIG. 3 is a diagram for illustrating conductive particles according to an embodiment and a movement of a polymer layer that limits a flow of conductive particles.

FIG. 3 is a diagram for illustrating conductive particles according to an embodiment and a movement of a polymer layer that limits a flow of conductive particles.

FIG. 3a shows a flow of conductive particles in the bonding process of an ACF including a polymer layer that limits a flow of conductive particles according to an embodiment.

FIG. 3b shows the state of the polymer layer that limits a flow of conductive particles after the bonding process of the ACF including the polymer layer that limits a flow of conductive particles according to an embodiment.

The ACF 100 including the polymer layer that limits a flow of conductive particles according to an embodiment is described in detail with reference to FIG. 3. In this case, the polymer layer 120 that limits a flow of conductive particles may be the aforementioned anchoring APL.

The ACF 100 including multiple conductive particles 110 according to an embodiment may include the polymer layer 120 and an adhesive layer 130.

The multiple conductive particles 110 are dispersely disposed in the polymer layer 120 and can limit a movement of the disposed multiple conductive particles 110 by capturing the multiple conductive particles 110.

The polymer layer 120 may be made of polymer having tensile stress that limits a flow of the multiple conductive particles 110 when a flow of resin occurs due to a bonding process by connecting the multiple conductive particles 110.

In this case, the polymer layer 120 may be made of thermoplastic polymer not having an adhesive property and has wide selection of materials because thermoplastic polymer having tensile stress to limit a flow of the multiple conductive particles 110 when a flow of resin occurs due to a bonding process has only to be used as the polymer layer 120.

For example, materials, such as those of Table 1, may be used as the polymer layer 120.

TABLE 1

| Nos. | APL polymer | Polymer solvent |
|---|---|---|
| 1 | Polybutadiene succinate (PBS) | Chloroform + N,N-Dimethylmethanamide |
| 2 | Polyvinyl fluoride (PVDF) | Acetone + Dimethylacetamide |
| 3 | Nylon 666 | Chloroform + Formic acid |
| 4 | Nylon 66 | |
| 5 | Nylon 6 | |
| 6 | Nylon 12 | |
| 7 | Polyacrylonitrile (PAN) | N,N-Dimethylmethanamide |

A polymer skin layer surrounding the top and bottom of the multiple conductive particles 110 disposed within the polymer layer 120 is removed. Accordingly, the conductive particles may connect the upper electrode and the lower electrode to form electrical bonding.

For example, in the polymer layer 120, the polymer skin layer surrounding the top and bottom of the multiple conductive particles 110 is removed through vertical ultrasonic bonding, thereby forming electrical bonding between the upper electrode and the lower electrode.

The polymer layer 120 may be fabricated through roll-to-roll coating by mixing and dispersing the multiple conductive particles 110 into a polymer solution.

The adhesive layer may be formed at the top and bottom of the polymer layer 120 not having an adhesive property, thus assigning an adhesive property.

The adhesive layer may be formed at the top and bottom of the polymer layer 120 by the laminating or dual coating of a polymer adhesive layer of a non-conductive film (NCF). For example, the adhesive layer may be made of acrylic resin, cationic epoxy resin or anionic epoxy resin.

As described above, the ACF including the multiple conductive particles 110 according to an embodiment enables electrical bonding in a fine pitch or ultra-fine pitch in which the interval between the electrodes becomes fine because the polymer layer 120 suppresses a flow of the multiple conductive particles 110 and a high capture rate is implemented using a small amount of initial conductive particles.

Figure 4:
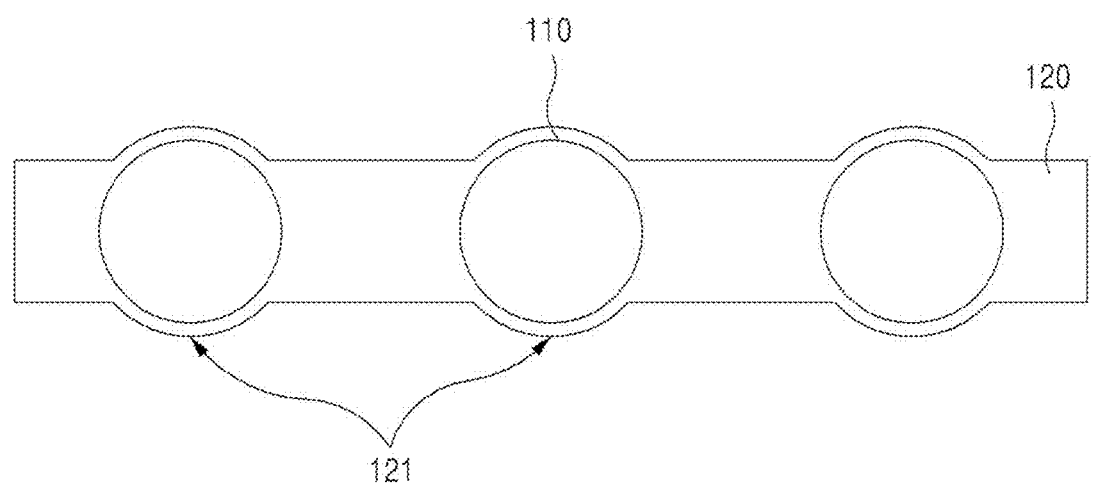
FIG. 4 is a diagram for illustrating a polymer layer that limits a flow of conductive particles from which a polymer skin has not been removed according to an embodiment.

FIG. 4 is a diagram for illustrating a polymer layer that limits a flow of conductive particles from which a polymer skin has not been removed according to an embodiment.

As shown in FIG. 4, while the polymer layer 120 that limits a flow of conductive particles is fabricated, the polymer of the polymer layer 120 that limits a flow of conductive particles surrounds the top and bottom of the conductive particles within the polymer layer 120 that limits a flow of conductive particles. This may be called a polymer skin layer 121. If the conductive particles of the polymer layer 120 that limits a flow of conductive particles is pressed between the electrode and the electrode in the state in which the polymer skin layer 121 has not been removed, the polymer skin layer 121 functions as an insulating layer, vertically hindering a stable electrical bonding.

Accordingly, a stable electrical bonding characteristic can be achieved after a bonding process only when the polymer skin layer 121 surrounding the conductive particles within the polymer layer is removed. Accordingly, a surface of the conductive particles needs to be exposed in order to implement an excellent electrical bonding characteristic of the APL ACF.

In order to expose the surface of the conductive particles by removing the polymer skin layer 121, a high-temperature bonding process needs to be performed at a temperature higher than the melting point of polymer forming the polymer layer 120 or an additional process, such as a plasma etching process or an ultrasonic process, is necessary. In this case, a stable electrical bonding can be achieved through the self-exposure of the surface of the conductive particles without the high-temperature bonding process or an additional process. Embodiments of the self-exposure are described more specifically later.

Figure 5:
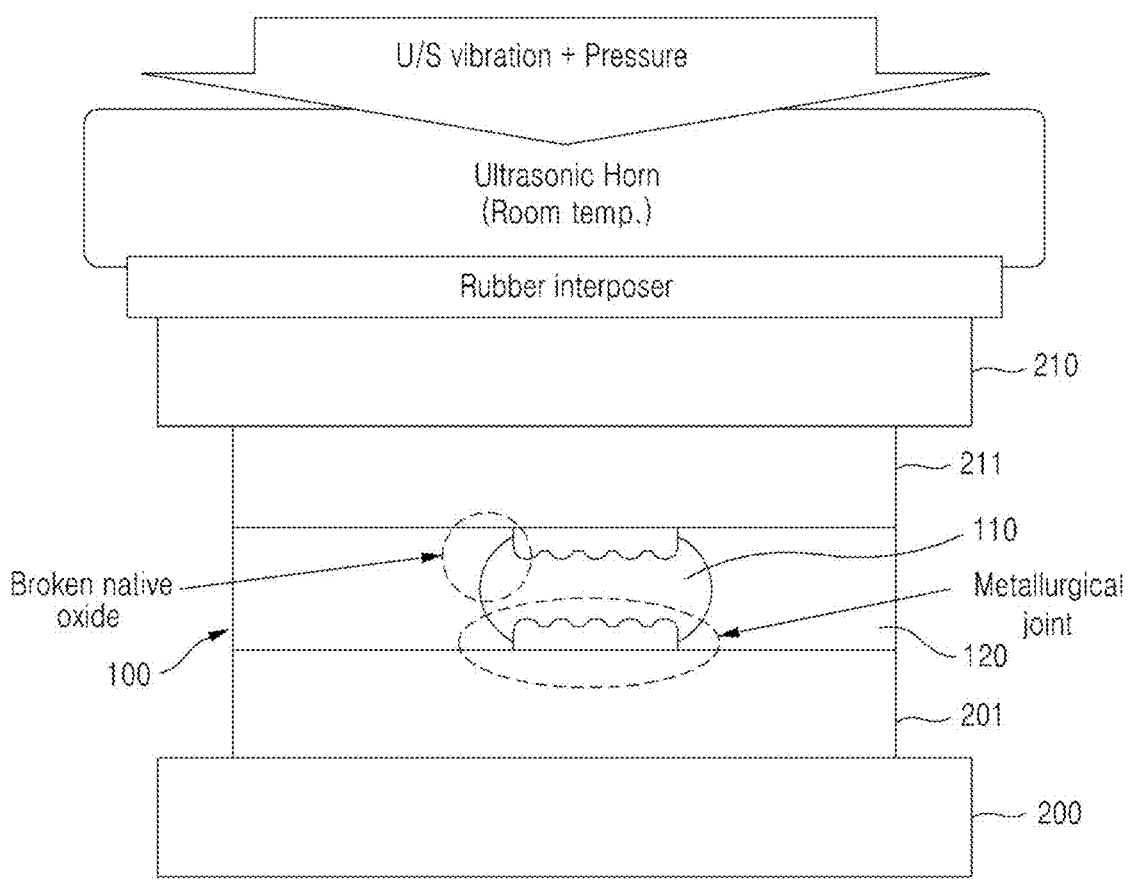
FIG. 5 is a diagram for illustrating the structure of a stable bonding state using conductive particles between two electrodes according to an embodiment.

FIG. 5 is a diagram for illustrating the structure of a stable bonding state using conductive particles between two electrodes according to an embodiment.

FIG. 5 shows an example of the structure of a stable bonding state using conductive particles between two electrodes. A polymer skin layer of a thin thickness that surrounds the conductive particles 110 may be removed using ultrasonic waves. For example, after the polymer skin layer of the conductive particles 110 is removed through vertical ultrasonic bonding, stable bonding may be formed between the two electrodes using the conductive particles 110.

The structure of the stable bonding state using the conductive particles between the two electrodes according to an embodiment may include the ACF 100 including the polymer layer that limits a flow of conductive particles according to an embodiment, which has been described with reference to FIGS. 3 and 4.

In the structure including the ACF 100 including the polymer layer that limits a flow of conductive particles according to an embodiment, the ACF 100 including the polymer layer that limits a flow of conductive particles is positioned between an upper substrate 210 and a lower substrate 200 and an ultrasonic (U/S) method is performed or heat and pressure are applied, thereby forming electrical bonding between upper and lower electrodes having a thickness of several tens of μm through the multiple conductive particles 110.

The upper electrode 211 may be formed under the upper substrate 210. For example, the upper substrate 210 may be a flexible printed circuit board (FPCB), but may be a printed circuit board (PCB) and is not limited thereto.

Furthermore, the lower electrode 201 may be formed over the lower substrate 200. For example, the lower substrate 200 may be a PCB, but may be an FPCB and is not limited thereto.

Each of the upper substrate 210 and the lower substrate 200 may be a fine-pitched or ultra-fine pitched substrate as the size of an electronic device is reduced.

The ACF 100 including the polymer layer that limits a flow of conductive particles is pressurized between the upper substrate 210 and the lower substrate 200, and may include the polymer layer 120 in which the multiple conductive particles 110 are disposed. In this case, the polymer skin layer surrounding the top and bottom of the multiple conductive particles 110 disposed within the polymer layer 120 is removed, so the conductive particles 110 may connect the upper electrode 211 of the upper substrate 210 and the lower electrode 201 of the lower substrate 200 to form electrical bonding.

More specifically, the ACF 100 including the polymer layer that limits a flow of conductive particles may include the polymer layer 120 and the adhesive layer. The polymer layer 120 has the multiple conductive particles 110 distributed therein, and can limit a movement of the multiple conductive particles 110 by capturing the multiple conductive particles 110. In this case, the polymer skin layer surrounding the top and bottom of the multiple conductive particles 110 disposed within the polymer layer 120 is removed, so the conductive particles 110 are connected between the upper electrode 211 and the lower electrode 201 to form electrical bonding. For example, in the polymer layer 120, the polymer skin layer surrounding the top and bottom of the multiple conductive particles 110 is removed through vertical ultrasonic bonding, thereby forming electrical bonding between the upper electrode 211 and the lower electrode 201.

Accordingly, the polymer skin layer of the conductive particles is effectively removed through vertical ultrasonic bonding, thereby forming stable electrical bonding. Furthermore, a flow of the conductive particles 110 is suppressed using the polymer layer 120 that limits a flow of conductive particles, and a high capture rate of the conductive particles 110 is implemented using a small amount of the initial conductive particles 110. Accordingly, price competitiveness can be secured because fine pitch bonding is possible using the ACF 100 including the polymer layer to limit a movement of the cheap conductive particles.

Figure 6:
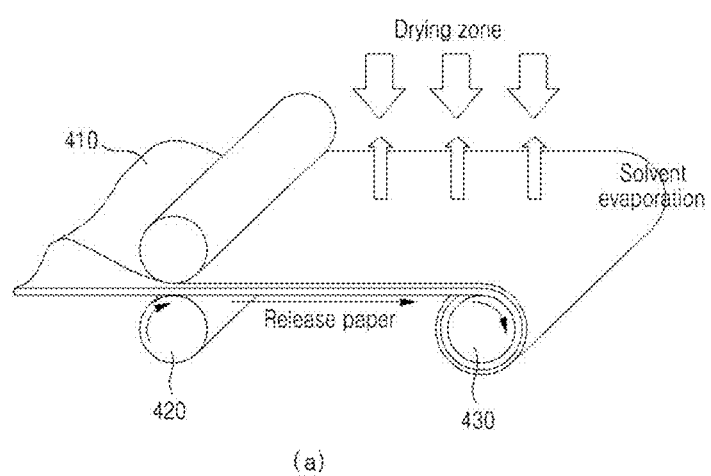
FIG. 6 is a diagram for illustrating an example of a process of fabricating a polymer layer that limits a flow of conductive particles according to an embodiment.
Figure 6:
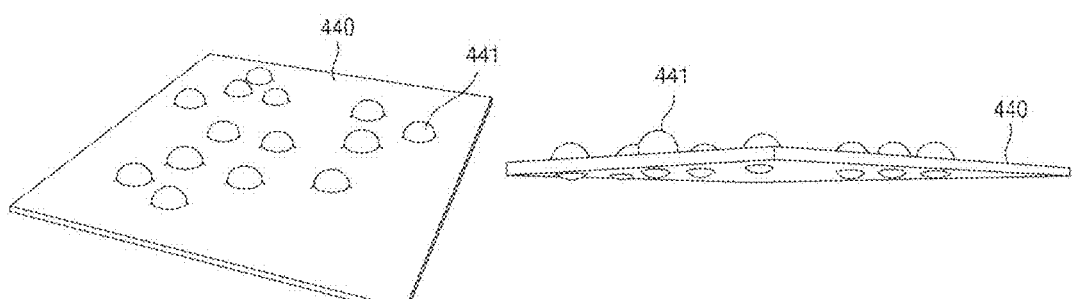

FIG. 6 is a diagram for illustrating an example of a process of fabricating a polymer layer that limits a flow of conductive particles according to an embodiment.

Referring to FIG. 6a, the polymer layer that limits a flow of conductive particles may be easily fabricated using a roll-to-roll coating method after the conductive particles are dispersed into a solution 410 in which the conductive particles and the polymer solution have been mixed. In this case, a calendar roll 420 for drying the solution 410 by passing the solution between rolls may be used. Release paper for moving the solution may be used. Furthermore, a receiving roll 430 for moving the solution may be used.

Accordingly, as shown in FIG. 6b, a polymer layer 440 that limits a flow of conductive particles may be formed. The polymer layer 440 to limit a movement of conductive particles has multiple conductive particles 441 distributed therein, and may fix the multiple conductive particles by limiting a movement of the multiple conductive particles although polymer resin flows.

In this case, an adhesive property needs to be assigned to the polymer layer 440 that limits a flow of conductive particles so that the polymer layer 440 can be used for display applications because the polymer layer 440 is made of thermoplastic polymer not having an adhesive property. Accordingly, the adhesive property may be assigned by forming the adhesive layer at the top and bottom of the polymer layer 440 that limits a flow of conductive particles.

Figure 7:
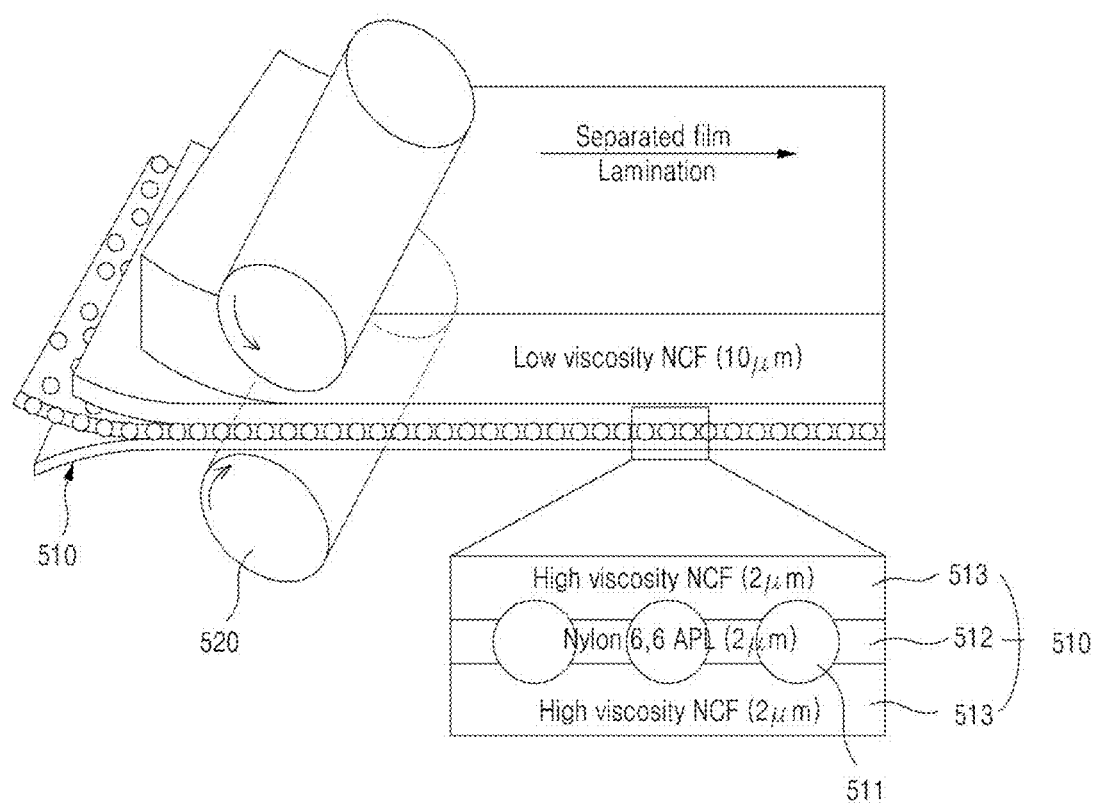
FIG. 7 shows a method of fabricating an ACF including a polymer layer that limits a flow of conductive particles according to an embodiment.

FIG. 7 shows a method of fabricating an ACF including a polymer layer that limits a flow of conductive particles according to an embodiment.

Referring to FIG. 7, in the method of fabricating an ACF 510 including a polymer layer that limits a flow of conductive particles according to an embodiment, after a polymer solution and multiple conductive particles 511 are mixed and dispersed, a polymer layer 512 that limits a flow of conductive particles may be formed by roll-to-roll coating on the polymer solution in which the multiple conductive particles 511 have been mixed.

Furthermore, an adhesive property may be assigned to the polymer layer 512 by laminating an adhesive layer 513 made of an NCF on the top and bottom of the polymer layer 512 that limits a flow of conductive particles.

Furthermore, a polymer skin layer surrounding the top and bottom of the multiple conductive particles 511 disposed within the polymer layer 512 that limits a flow of conductive particles is removed, so the multiple conductive particles 511 may be directly connected between an upper electrode and a lower electrode to form electrical bonding.

Figure 8:
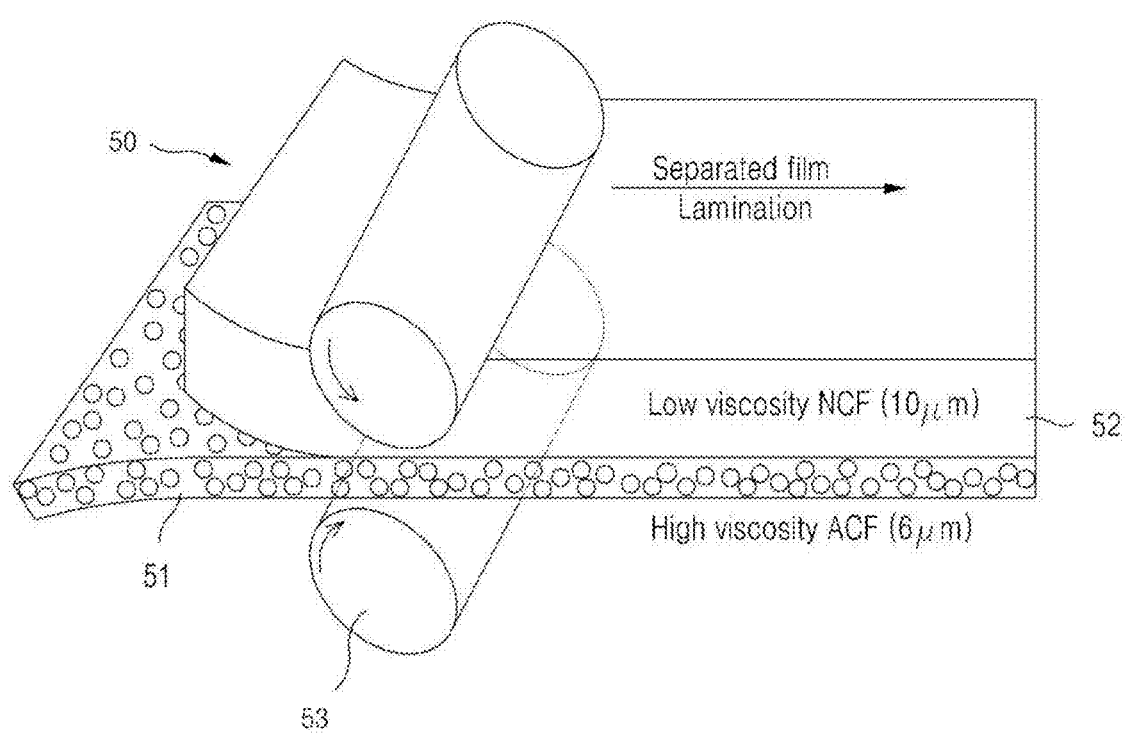
FIG. 8 shows a process of fabricating a conventional ACF.

FIG. 8 shows a process of fabricating a conventional ACF.

A process of fabricating the ACF 510 including the polymer layer that limits a flow of conductive particles according to an embodiment and a process of fabricating the conventional ACF may be compared with reference to FIGS. 7 and 8.

In the process of fabricating the ACF 510 including the polymer layer that limits a flow of conductive particles according to an embodiment, the ACF 510 can be simply fabricated through a lamination process with the adhesive layer 513, that is, an NCF not including conductive particles, using a roll laminator 520 that is identical with or similar to the process of fabricating a conventional ACF 50.

As shown in FIG. 8, in the case of the conventional ACF 50, when a process of laminating a polymer layer 51 including conductive particles and an NCF 52 is performed using a roll laminator 53, the conductive particles may flow because the resin of the NCF 52 flows according to electrical bonding.

In contrast, as shown in FIG. 7, in the ACF 510 including the polymer layer that limits a flow of conductive particles according to an embodiment, when bonding is performed using the ACF 510 including the polymer layer 512 that limits a flow of conductive particles and to which an adhesive property has been assigned by a process of laminating the polymer layer 512 and the adhesive layer 513, that is, an NCF, the conductive particles 511 rarely move regardless of a flow of the resin of the adhesive layer 513, that is, an NCF, because the conductive particles 511 have been captured in the polymer layer 512 that limits a flow of conductive particles. Accordingly, a movement of the conductive particles 511 before and after bonding can be suppressed.

Figure 9:
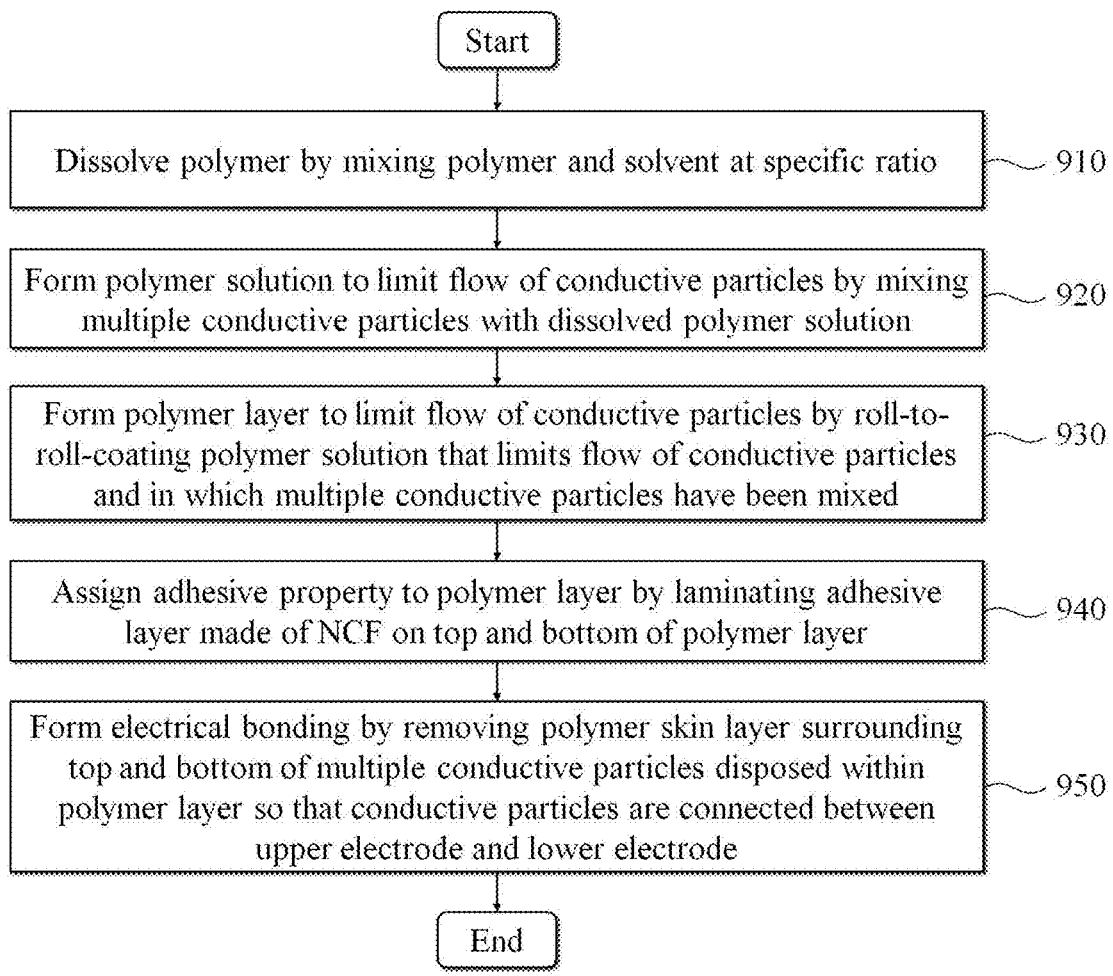
FIG. 9 is a flowchart illustrating an example of a method of fabricating an ACF including a polymer layer that limits a flow of conductive particles according to an embodiment.

FIG. 9 is a flowchart illustrating an example of a method of fabricating an ACF including a polymer layer that limits a flow of conductive particles according to an embodiment.

Referring to FIG. 9, the method of fabricating an ACF including a polymer layer that limits a flow of conductive particles according to an embodiment includes the step 910 of dissolving polymer by mixing the polymer and a solvent at a specific ratio, the step 920 of forming a polymer solution that limits a flow of conductive particles by mixing multiple conductive particles with the dissolved polymer solution, and the step 930 of forming a polymer layer that limits a flow of conductive particles by roll-to-roll-coating the polymer solution that limits a flow of conductive particles and in which the multiple conductive particles have been mixed.

Furthermore, the method may further include the step 940 of assigning an adhesive property to the polymer layer by laminating the adhesive layer made of an NCF on the top and bottom of the polymer layer.

Furthermore, the method may further include the step 950 of forming electrical bonding by removing a polymer skin layer surrounding the top and bottom of the multiple conductive particles disposed within the polymer layer so that the conductive particles are connected between an upper electrode and a lower electrode.

In this case, the polymer layer can limit a movement of the multiple conductive particles by capturing them when a flow of resin occurs due to a bonding process.

Hereinafter, the steps of the method of fabricating an ACF including a polymer layer that limits a flow of conductive particles according to an embodiment are described in detail by taking an example.

The method of fabricating an ACF including a polymer layer that limits a flow of conductive particles according to an embodiment may be used to fabricate the ACF including the polymer layer that limits a flow of conductive particles, which has been described with reference to FIGS. 3 to 7. For example, the method may be implemented by a system for fabricating an ACF.

At step 910, the polymer may be dissolved by mixing the polymer and the solvent at a specific ratio. Content of the polymer is 7 wt % or more. If the polymer of less than 7 wt % is dissolved, it is not formed into a film in a dry process, that is, one of processes of forming a film.

At step 920, the polymer solution that limits a flow of conductive particles may be formed by mixing the multiple conductive particles with the dissolved polymer solution. In this case, the multiple conductive particles may be distributed in the polymer solution.

At step 930, the polymer layer that limits a flow of conductive particles may be fabricated by roll-to-roll-coating the polymer solution in which the multiple conductive particles have been mixed and that limits a flow of the conductive particles. The polymer layer can limit a movement of the multiple conductive particles by capturing them when a flow of resin occurs due to a bonding process.

More specifically, after the polymer solution with which the multiple conductive particles have been mixed and that limits a flow of the conductive particles is injected into the entrance of a roll-to-roll film coater, the rolls may rotate at specific speed so that the polymer solution passes through a narrow gap between the two rolls. Thereafter, a solvent evaporates through a drying zone, thereby fabricating the polymer layer that limits a flow of conductive particles. The polymer layer may be made of polymer that connects the multiple conductive particles and has tensile stress to limit a flow of the multiple conductive particles when a flow of resin occurs due to a bonding process.

Furthermore, the multiple conductive particles may consist of solders or conductive particles including solders. The multiple conductive particles consisting of solders or conductive particles including solders are distributed in the polymer layer, so the polymer layer can limit a movement of the multiple conductive particles by capturing them when a flow of resin occurs due to a bonding process.

At step 940, after the polymer layer that limits a flow of conductive particles is fabricated, an adhesive property may be assigned by laminating the adhesive layer made of an NCF on the top and bottom of the polymer layer.

At step 950, electrical bonding may be formed by removing the polymer skin layer that surrounds the top and bottom of the multiple conductive particles disposed within the polymer layer so that the conductive particles are connected between the upper electrode and the lower electrode.

In this case, the polymer skin layer of the polymer layer that surrounds the top and bottom of the multiple conductive particles may be removed through a vertical ultrasonic bonding process.

According to embodiments, excellent electrical bonding can be formed by removing the polymer skin layer surrounding the conductive particles using vertical ultrasonic waves when the bonding process of the ACF using the anchoring APL including metal conductive particles based on various thermoplastic polymers and the ACF including the polymer layer that limits a flow of conductive particles is performed.

Compared to the existing expensive plasma etching method of exposing conductive particles surrounded by polymer, the conductive particles are exposed with respect to the polymer and can also be connected by generating vertical ultrasonic waves during the bonding process.

The ACF including the polymer layer that fundamentally suppresses a flow of conductive particles has a new structure different from that of a conventional ACF, and can further suppress a flow of conductive particles regardless of materials, a form and a fabrication method without being limited to an expensive nano fiber functioning to suppress a flow of conductive particles.

Furthermore, the width of selection of polymer materials is wide, and a cheap process can be performed through vertical ultrasonic waves generated during a bonding process without the intervention of an expensive plasma etching process.

A display having an ultra-fine pitch assembly is used for home appliances and industrial IT devices, such as TV, notebooks, mobile phones, game machines, and an ATM, and it continues to grow and has a great ripple effect in the entire industry. An ACF essentially used for such a display and packaging products continues to grow, and it is extended and applied to other fields. An anchoring APL ACF product can be widely applied to the chip on glass (COG), chip on flex (COF) and chip on packaging (COP) of large/small- and-medium LCD/OLED displays having an ultra-fine pitch. Furthermore, if the type of conductive particles is changed, the anchoring APL ACF product can also be applied to the CCD-CMOS camera module connection field for increasing the number of pixels of a high-picture quality camera and OLEDs for virtual reality (VR) that require picture quality of the UHD or more. Furthermore, the ACF including the polymer layer that limits a flow of conductive particles and having high reliability can also be applied to wearable electronic devices.

In particular, as the demands for electronic devices, such as large-sized and thin TV, notebooks and smartphones, increase and the need for the ACF also increases in small- and-medium displays for game machines, navigators and vehicles, the ACF market shows a steady growth of 5-6% after the year of 2010. However, the growth width of the ACF is reduced although the final demands for the display increase because cost reduction pressure is severe due to materials used for display parts. Accordingly, the ACK market encounters a volume entry barrier.

According to embodiments, an electrical short problem and a high contact resistance problem which may occur in ultra-fine pitch applications can be solved by suppressing a flow of conductive particles using a high-strength and thin polymer film as far as possible. This is a technology quite different from the existing Japan's ACF for a fine pitch and is an original patent technology advanced from the existing Japan's patent.

Figure 10:
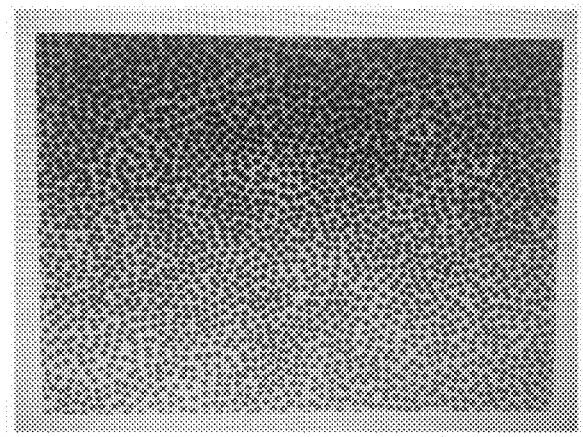
FIG. 10 is a diagram for illustrating an ACF to which a conventional roll-to-roll system is difficult to apply.
Figure 10:
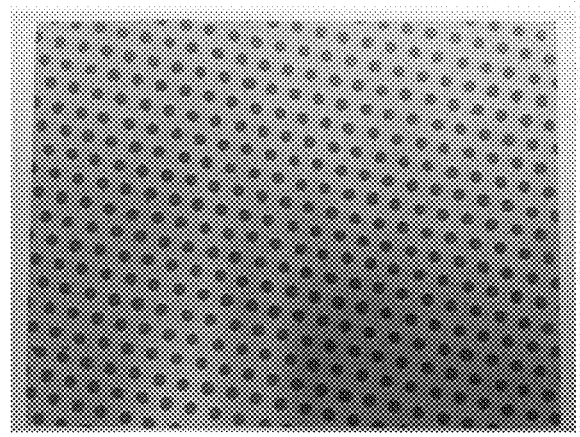

FIG. 10 is a diagram for illustrating an ACF to which a conventional roll-to-roll system is difficult to apply.

For example, Hitachi Chemical and Dexerials that monopolize the current ACF market do not implement a system for suppressing a flow of conductive particles and preventing an aggregation using a specific structure, such as an anchoring polymer layer. Hitachi is focused on the super dispersion of conductive particles as shown in FIG. 10a, and Dexerials are focused on the array of conductive particles as shown in FIG. 10b. However, the two companies have a difficulty in mass production because the application of the roll-to-roll system is difficult.

In contrast, the ACF including the polymer layer that limits a flow of conductive particles according to the present embodiment can be fabricated by a simple process through the roll-to-roll system. Furthermore, lamination bonding with an NCF formed at the top and bottom can be performed using the roll laminator widely used in the existing industry. Accordingly, the ACF has innovativeness for easy grafting into mass production, and can significantly reduce the cost in an equipment setup and process optimization process. Accordingly, it is expected that new growth power can be provided to electronic material companies by supplying a high-performance cheap ACF including a polymer layer that limits a flow of conductive particles and the market share of Hitachi Chemical and Dexerials that monopolize the ACF market can be significantly reduced.

As described with reference to FIG. 4, in order to expose a surface of the conductive particles by removing the polymer skin layer 121 surrounding the conductive particles, a high-temperature bonding process needs to be performed at a temperature higher than the melting point of polymer forming the polymer layer 120 or there is a need for an additional process, such as a plasma etching process or an ultrasonic process. Embodiments in which stable electrical bonding can be obtained through the self-exposure of a surface of conductive particles without a high-temperature bonding process or an additional process are described below.

Figure 11:
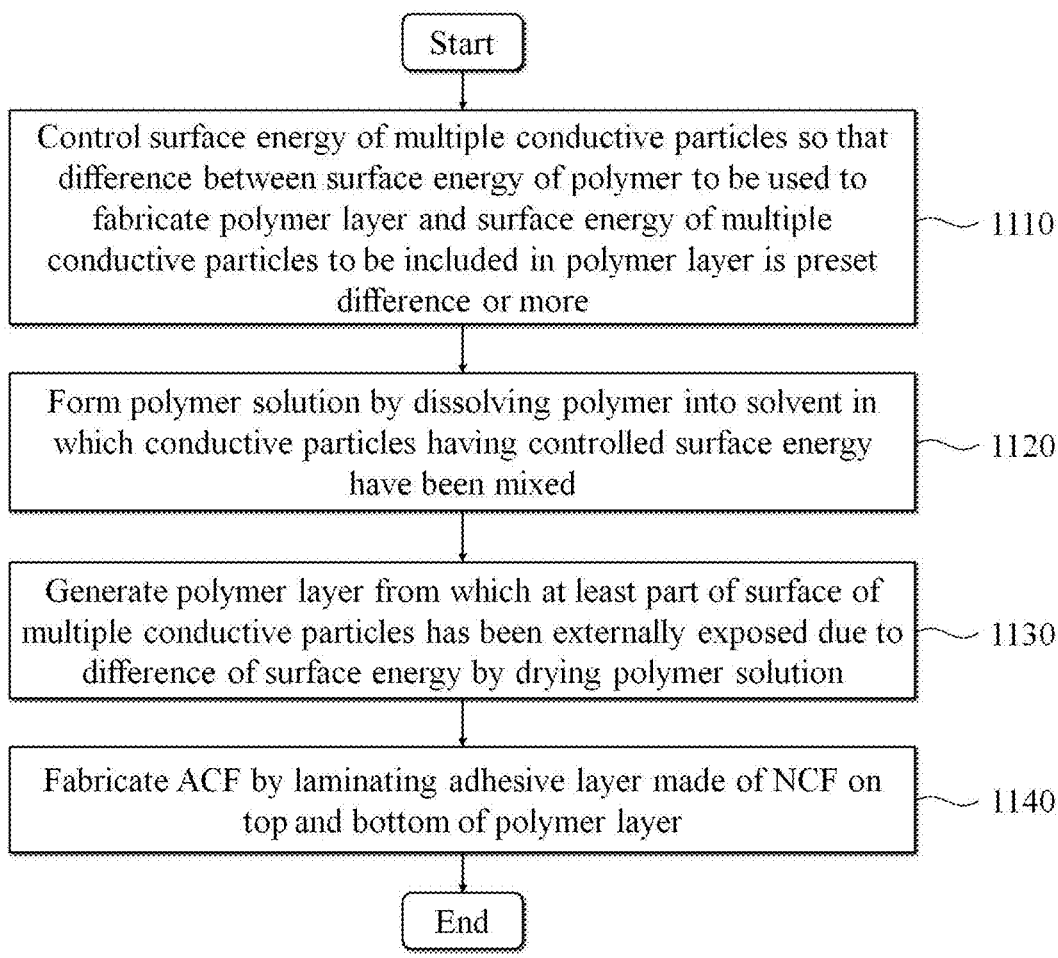
FIG. 11 is a flowchart illustrating an example of a self-exposure method for a surface of conductive particles according to an embodiment.

FIG. 11 is a flowchart illustrating an example of a self-exposure method for a surface of conductive particles according to an embodiment. The self-exposure method may include a technology capable of self-exposing at least part of a surface of the conductive particles included in the polymer layer to the outside of the polymer layer in the process of providing the polymer layer. Referring to FIG. 11, the self-exposure method according to an embodiment may include the step 1110 of controlling surface energy of multiple conductive particles so that a difference between surface energy of polymer to be used to fabricate a polymer layer and surface energy of the multiple conductive particles to be included in the polymer layer is a preset difference or more, the step 1120 of forming a polymer solution by dissolving the polymer into a solvent in which the conductive particles having controlled surface energy have been mixed, the step 1130 of generating the polymer layer from which at least part of a surface of the multiple conductive particles has been externally exposed due to the difference of the surface energy by drying the polymer solution, and the step 1140 of fabricating an ACF by laminating an adhesive layer made of an NCF on the top and bottom of the polymer layer.

The step 1110 may be a process of controlling the surface energy of the conductive particles by coating a hydrophobic substance on a surface of the conductive particles if the polymer has a hydrophilic property or by coating a hydrophilic substance on a surface of the conductive particles if the polymer has a hydrophobic property, for example. The hydrophilic property may mean that surface energy is relatively high, and a hydrophobic property may mean that surface energy is relatively low. In other words, if the polymer has a hydrophilic property, a surface energy difference between the polymer and the conductive particles can be increased by coating a hydrophobic substance on a surface of the conductive particles to reduce the surface energy of the conductive particles. Inversely, if the polymer has a hydrophobic property, a surface energy difference between the polymer and the conductive particles can be increased by coating a hydrophilic substance on a surface of the conductive particles to increase the surface energy of the conductive particles.

When the surface energy difference is the preset difference or more, at step 1140, the polymer may flow down along the surface of the conductive particles in the process of generating the polymer layer by drying the polymer solution, so at least part of the surface of the conductive particles may be self-exposed. Accordingly, vertically stable electrical bonding can be implemented through the polymer layer not including a polymer skin without the high-temperature bonding process or the additional process, such as plasma etching process or an ultrasonic process.

For example, at step 1110, the self-exposure of the surface of the conductive particles can be implemented using a sputtering method of dissolving a hydrophobic substance into the solvent in which the multiple conductive particles have been mixed if the polymer has a hydrophilic property or dissolving a hydrophilic substance into the solvent in which the multiple conductive particles have been mixed if the polymer has the hydrophobic so that the substance is coated on the surface of the conductive particles.

In this case, the degree that surface energy of the conductive particles is changed can be controlled by adjusting content of the hydrophobic substance and dissolved into the solvent or content of the hydrophilic substance and dissolved into the solvent.

In this case, the hydrophobic substance and coated on the surface of the conductive particles or the hydrophilic substance and coated on the surface of the conductive particles may have conductivity for stable electrical bonding.

As a more detailed embodiment, the polymer may include polyacrylonitrile having a hydrophilic property. At step 1110, surface energy of the conductive particles may be controlled by coating oleic acid on the surface of the conductive particles to assign a hydrophobic property. In other words, the polymer having a hydrophilic property flows down along a surface of the conductive particles having a hydrophobic in the process of fabricating the polymer layer, so part of the surface of the conductive particles may be self-exposed to the outside of the polymer layer.

In this case, at step 1110, oleic acid having content of 20 wt % or more with respect to the polymer solution may be stirred by dissolving the oleic acid into the solvent in which the multiple conductive particles have been mixed so that the oleic acid is coated on the surface of the conductive particles, thereby being capable of controlling the surface energy of the conductive particles.

Furthermore, the polymer layer may include polymer having tensile stress to limit a flow of the multiple conductive particles when the polymer layer connects the multiple conductive particles and a flow of resin occurs due to a bonding process. The anchoring of the conductive particles has already been described in detail above.

Furthermore, at step 1130, the polymer layer that limits a flow of conductive particles may be fabricated by roll-to-roll-coating the polymer solution in which the multiple conductive particles having controlled surface energy have been mixed. Such roll-to-roll coating has been described in detail with reference to FIGS. 6 and 7.

In order to fabricate the ACF, the self-exposure method may include the step 1140 of fabricating the ACF by laminating the adhesive layer made of an NCF on the top and bottom of the polymer layer. This step may correspond to the step 940 of FIG. 9. To form electrical bonding through the conductive particles by connecting the generated ACF between the upper electrode and the lower electrode has already been described in detail above.

Figure 12:
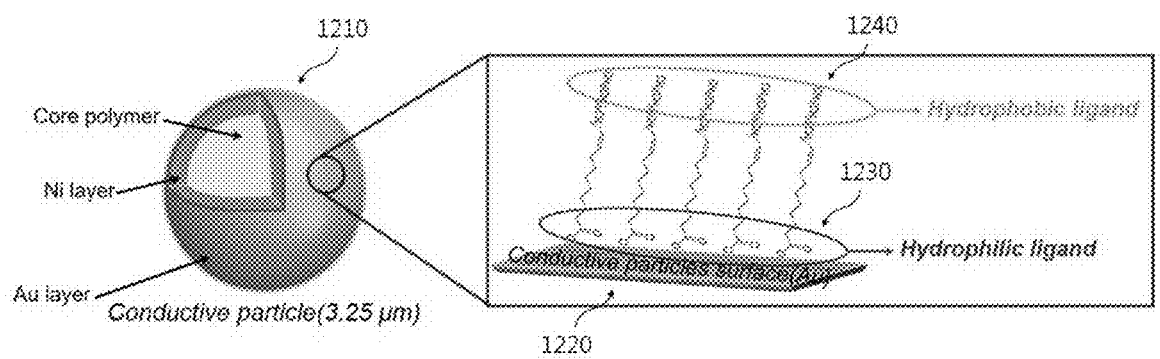
FIG. 12 shows an example of the state in which oleic acid has reacted to a surface of the conductive particles in one embodiment.

FIG. 12 shows an example of the state in which oleic acid has reacted to a surface of conductive particles in one embodiment. FIG. 12 shows an example of a conductive particle 1210 formed to include a core polymer, a nickel (Ni) layer on the core polymer, and a gold (Au) layer 1220 on the Ni layer. Furthermore, there is shown that a surface of the conductive particle 1210 may change from a hydrophilic ligand 1230 to a hydrophobic ligand 1240 as oleic acid is coated on the Au layer 1220. In other words, by coating the oleic acid on a surface of the conductive particle 1210, the surface of the conductive particle 1210 changes from a hydrophilic property to a hydrophobic property, so surface energy is lowered. If polymer having a hydrophilic property is used, a difference in the surface energy is increased, and the self-exposure of the surface of the conductive particle 1210 is made possible using the difference in the surface energy.

Figure 13:
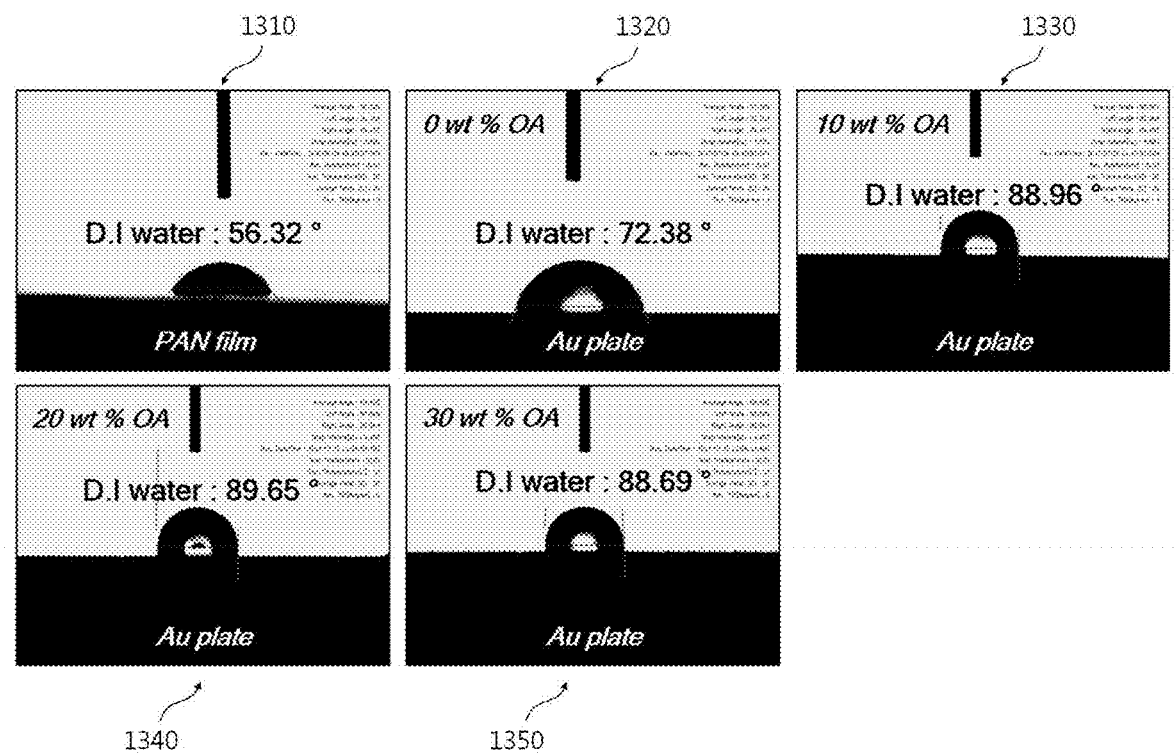
FIG. 13 shows an example of hydrophobic property appearance according to oleic acid content in one embodiment.

FIG. 13 shows an example of hydrophobic property appearance according to oleic acid content in one embodiment. In FIG. 13, a first experiment example 1310 shows an example in which in order to use polyacrylonitrile (hereinafter referred to as "PAN") as the polymer, a PAN film was fabricated and hydrophilic/hydrophobic characteristics were checked. More specifically, in the first experiment example 1310, D.I water dropped on the PAN film and a wetting angle was measured. In this case, the first experiment example 1310 shows that the PAN has a hydrophilic property as in 56.32°.

Likewise, in FIG. 13, a second experiment example 1320, a third experiment example 1330, a fourth experiment example 1340 and a fifth experiment example 1350 show examples in which hydrophilic/hydrophobic characteristics for a surface of the conductive particles were checked. FIG. 13 shows that the surface of the conductive particles had a hydrophobic property as the results of the experiments performed by increasing oleic acid content within the polymer solution like 0 wt %, 10 wt %, 20 wt %, and 30 wt % in the second to fifth experiment examples and the hydrophobic property was increased as oleic acid was included.

Figure 14:
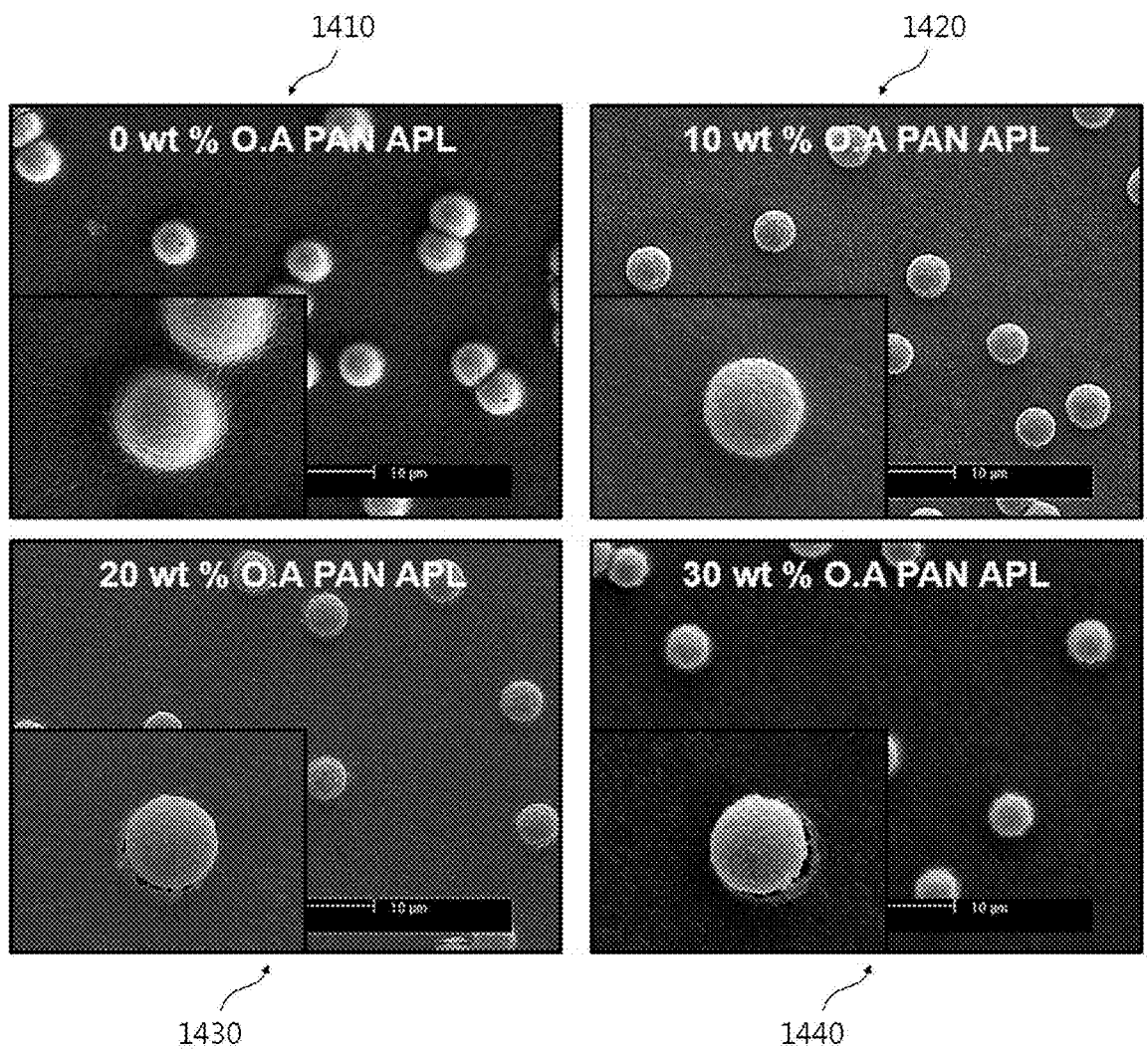
FIG. 14 shows scanning electron microscope (SEM) images of PAN APL surfaces according to oleic acid content in one embodiment.

FIG. 14 shows scanning electron microscope (SEM) images of PAN APL surfaces according to oleic acid content in one embodiment. After oleic acid and conductive particles were added to a solvent capable of dissolving both oleic acid and PAN, the oleic acid was stirred so that it was coated on a surface of the conductive particles. Thereafter, a polymer solution was fabricated by mixing the oleic acid and the PAN. Thereafter, a polymer solution was fabricated in a film form according to the aforementioned embodiments using the roll-to-roll film coating method.

The SEM images of FIG. 14 show surfaces of PAN APLs fabricated based on content of oleic acid. It may be seen that in a first embodiment 1410 in which content of oleic acid included in the polymer solution was 0 wt % and a second embodiment 1420 in which content of oleic acid included in the polymer solution was 10 wt %, surfaces of the conductive particles have polymer skins, whereas in a third embodiment 1430 in which content of oleic acid included in the polymer solution was 20 wt % and a fourth embodiment 1440 in which content of oleic acid included in the polymer solution was 30 wt %, surfaces of the conductive particles have been self-exposed to the outside of the polymer layer without a polymer skin.

Figure 15:
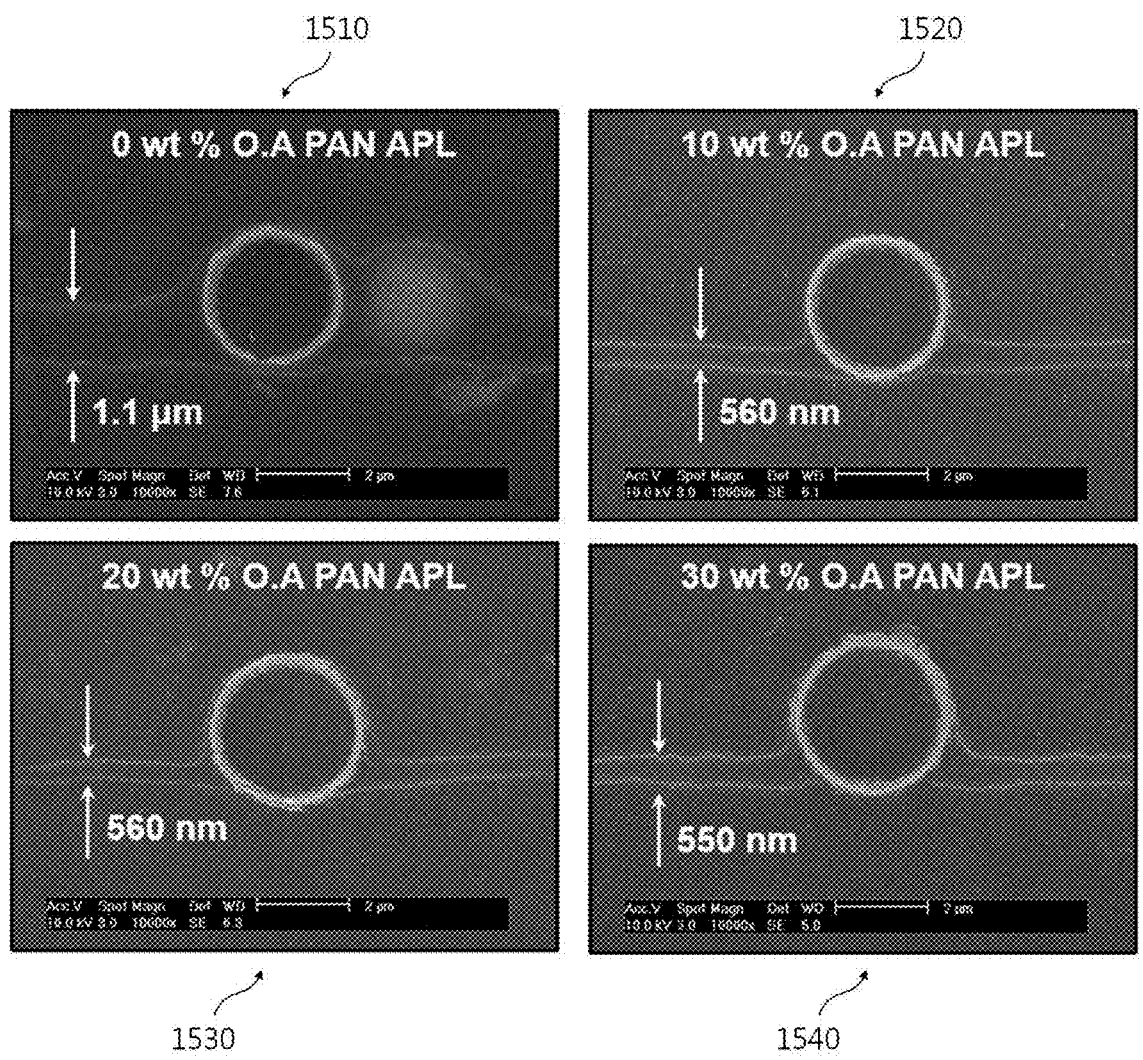
FIG. 15 shows SEM images of PAN APL cross sections according to oleic acid content in one embodiment.

FIG. 15 shows SEM images of PAN APL cross sections according to oleic acid content in one embodiment. FIG. 15 shows four embodiments 1510 to 1540 performed using the same method as that described with reference to FIG. 14. In this case, the first embodiment 1510 in which content of oleic acid included in the polymer solution was 0 wt % shows that a polymer skin was present at the top and bottom of a conductive particle. Furthermore, the second embodiment 1520 in which content of oleic acid included in the polymer solution was 10 wt % shows that a polymer skin was not present at the top of the conductive particle, but a polymer skin was present at the bottom of the conductive particle. In contrast, it may be seen that the third embodiment 1530 in which content of oleic acid included in the polymer solution was 20 wt % and the fourth embodiment 1540 in which content of oleic acid included in the polymer solution was 30 wt % show that an anchoring polymer layer was well fabricated without a polymer skin at the top and bottom of a conductive particle.

Figure 16:
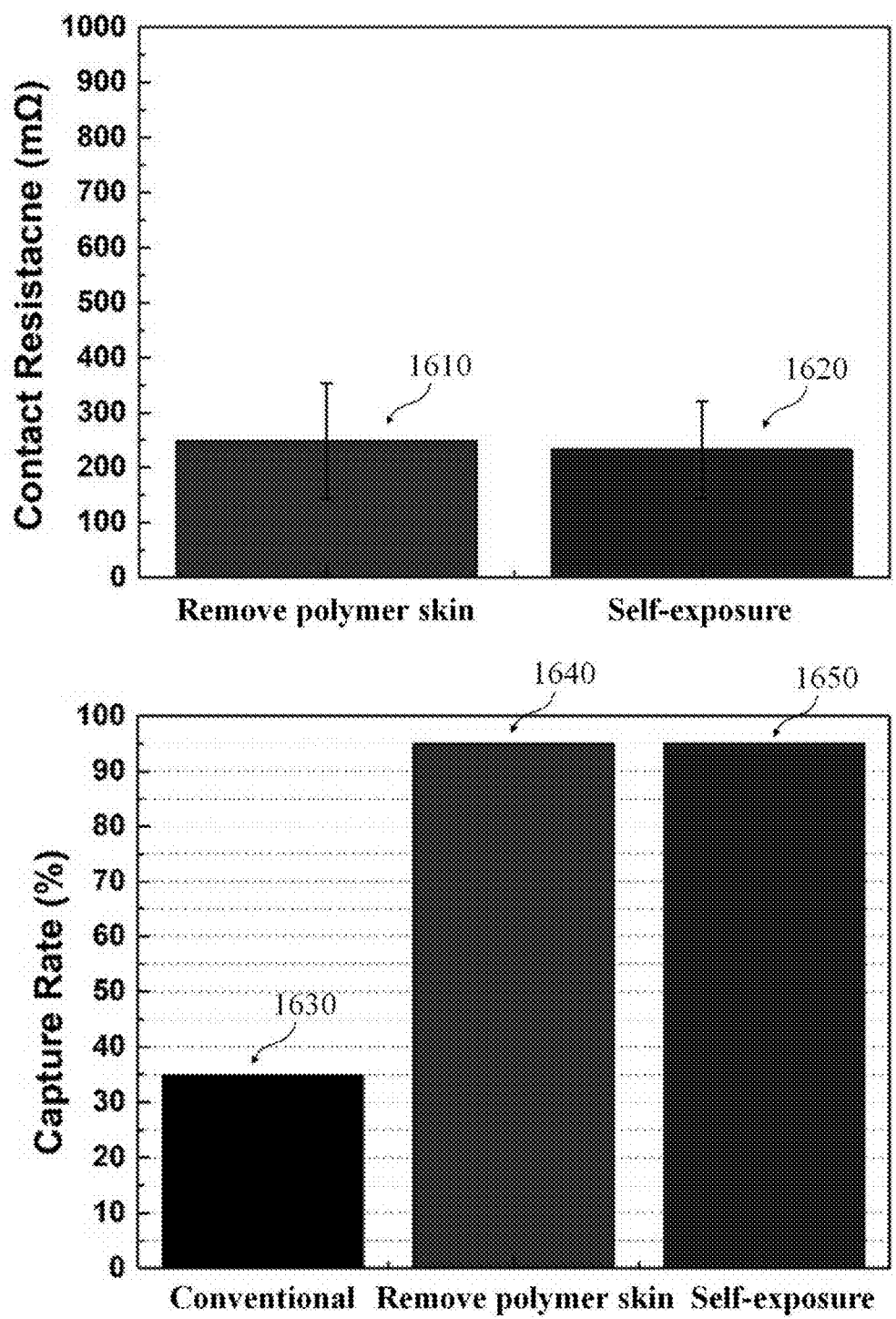
FIG. 16 shows graphs illustrating examples of contact resistance of ACFs of a method of removing a polymer skin and ACFs according to the self-exposure method in one embodiment.

FIG. 16 shows graphs illustrating examples of contact resistance of ACFs of a method of removing a polymer skin and ACFs according to the self-exposure method in one embodiment. In the upper graph of FIG. 16, first results 1610 show contact resistance in a bonding process using an ACF fabricated by removing a polymer skin through an ultrasonic process, and second results 1620 show contact resistance in a bonding process using an ACF fabricated by including oleic acid having content of 20 wt % in the polymer solution in order to derive the self-exposure of conductive particles. Similarity between the first results 1610 and the second results 1620 may mean that stable electrical bonding can be performed because the conductive particles can be well self-exposed by only controlling surface energy of the conductive particles without using an additional process for removing a polymer skin.

Furthermore, in the lower graph of FIG. 16, third results 1630 show a capture rate of conventional conductive particles, fourth results 1640 show a capture rate of conductive particles when a polymer skin was removed by applying $O_2$ plasma etching to an anchoring polymer layer, and fifth results 1650 show a capture rate of conductive particles when a self-exposure method of conductive particles was. It may be seen that stable electrical bonding can be performed because the conductive particles can be well self-exposed by only controlling surface energy of the conductive particles without using an additional process for removing a polymer skin.

Figure 17:
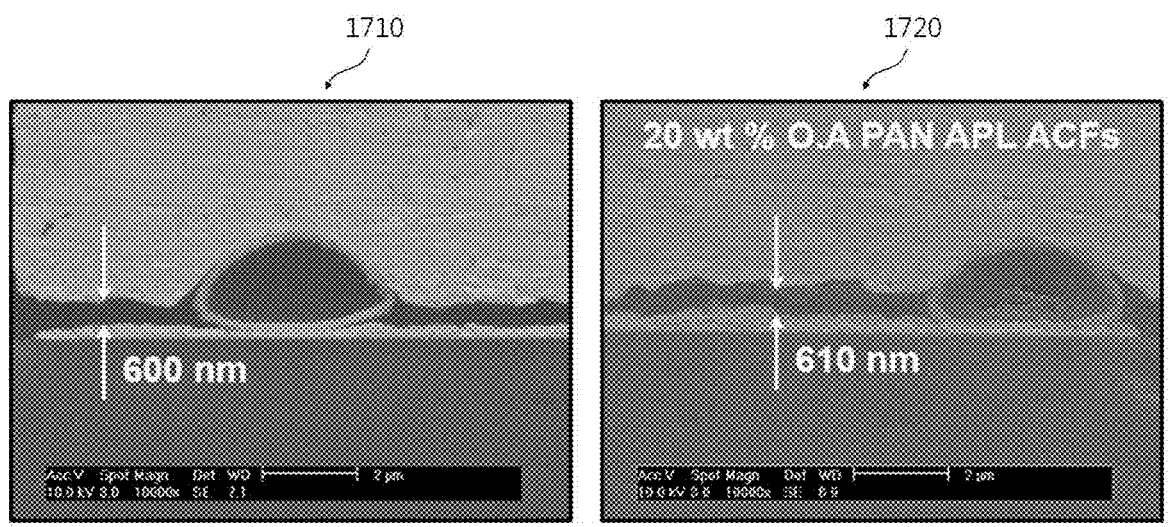
FIG. 17 shows cross-sectional SEM images of ACFs of a method of removing a polymer skin and ACFs according to the self-exposure method in one embodiment.

FIG. 17 shows cross-sectional SEM images of ACFs of a method of removing a polymer skin and ACFs according to the self-exposure method in one embodiment. In FIG. 17, both a first cross-section image 1710 according to a bonding process using an ACF fabricated by removing a polymer skin through an ultrasonic process and a second cross-section image 1720 according to a bonding process using an ACF fabricated by including oleic acid having content of 20 wt % in the polymer solution so that the self-exposure of conductive particles is derived show that a joint gap size of about 600 nm was formed between an upper electrode and a lower electrode. FIG. 17 also shows that stable electrical bonding can be performed because the conductive particles can be well self-exposed by only controlling surface energy of the conductive particles without using an additional process for removing a polymer skin.

There is provided the self-exposure method capable of self-exposing at least part of a surface of the conductive particles because the polymer flows down along the surface of the conductive particles by controlling surface energy of the conductive particles in the process of fabricating the polymer layer including the conductive particles.

There are provided the method of fabricating an ACF using the self-exposure and the ACF fabricated by the method.

As described above, although the embodiments have been described in connection with the limited embodiments and the drawings, those skilled in the art may modify and change the embodiments in various ways from the description. For example, proper results may be achieved although the aforementioned descriptions are performed in order different from that of the described method and/or the aforementioned elements, such as the system, configuration, device, and circuit, are coupled or combined in a form different from that of the described method or replaced or substituted with other elements or equivalents.

Accordingly, other implementations, other embodiments, and the equivalents of the claims belong to the scope of the claims.

What is claimed is:

1. A self-exposure method for a surface of conductive particles within a polymer layer, the method comprising:
controlling a surface energy of multiple conductive particles so that a difference between a surface energy of polymer to be used to fabricate the polymer layer and the surface energy of the multiple conductive particles to be included in the polymer layer is a preset difference or more;
forming a polymer solution by dissolving the polymer into a solvent in which the conductive particles having controlled surface energy have been mixed; and
generating the polymer layer from which at least part of a surface of the multiple conductive particles has been externally exposed due to a difference not less than the preset difference between the surface energy of the polymer and the surface energy of the multiple conductive particles by drying the polymer solution,
wherein controlling the surface energy comprises controlling the surface energy of the conductive particles by coating a hydrophobic substance on the surface of the conductive particles if the polymer has a hydrophilic property or coating a hydrophilic substance on the surface of the conductive particles if the polymer has a hydrophobic property.

2. A self-exposure method for a surface of conductive particles within a polymer layer, the method comprising:
controlling a surface energy of multiple conductive particles so that a difference between a surface energy of polymer to be used to fabricate the polymer layer and the surface energy of the multiple conductive particles to be included in the polymer layer is a preset difference or more;
forming a polymer solution by dissolving the polymer into a solvent in which the conductive particles having controlled surface energy have been mixed; and
generating the polymer layer from which at least part of a surface of the multiple conductive particles has been externally exposed due to a difference not less than the preset difference between the surface energy of the polymer and the surface energy of the multiple conductive particles by drying the polymer solution, wherein controlling the surface energy comprises stirring a hydrophobic substance if the polymer has a hydrophilic property or a hydrophilic substance if the polymer has a hydrophobic property by dissolving the substance into the solvent in which the multiple conductive particles have been mixed so that the substance is coated on the surface of the conductive particles.

3. The method of claim 2, wherein controlling the surface energy comprises controlling a degree that the surface energy of the conductive particles is changed by adjusting content of the hydrophobic substance dissolved into the solvent in which the multiple conductive particles have been mixed or content of the hydrophilic substance dissolved into the solvent.

4. The method of claim 1, wherein the hydrophobic substance or hydrophilic substance coated on the surface of the conductive particles has conductivity.

5. A self-exposure method for a surface of conductive particles within a polymer layer, the method comprising:
controlling a surface energy of multiple conductive particles so that a difference between a surface energy of polymer to be used to fabricate the polymer layer and the surface energy of the multiple conductive particles to be included in the polymer layer is a preset difference or more;
forming a polymer solution by dissolving the polymer into a solvent in which the conductive particles having controlled surface energy have been mixed; and
generating the polymer layer from which at least part of a surface of the multiple conductive particles has been externally exposed due to a difference not less than the preset difference between the surface energy of the polymer and the surface energy of the multiple conductive particles by drying the polymer solution, wherein:
the polymer comprises polyacrylonitrile having a hydrophilic property, and
controlling the surface energy comprises controlling the surface energy of the conductive particles by coating oleic acid on the surface of the conductive particles in order to assign a hydrophobic property.

6. The method of claim 1, wherein controlling the surface energy comprises controlling the surface energy of the conductive particles by coating oleic acid having content of 20 wt % or more with respect to the polymer solution on the surface of the conductive particles in such a way as to stir the oleic acid by dissolving the oleic acid into the solvent in which the multiple conductive particles have been mixed.

7. The method of claim 1, further comprising fabricating an anisotropic conductive film (ACF) by laminating an adhesive layer made of a non-conductive film (NCF) at a top and bottom of the polymer layer.

8. The method of claim 1, wherein the polymer layer comprises polymer having tensile stress to limit a flow of the multiple conductive particles when the polymer layer connects the multiple conductive particles and a flow of resin occurs due to a bonding process.

9. The method of claim 1, wherein generating the polymer layer comprises fabricating the polymer layer to limit a flow of the conductive particles by roll-to-roll-coating the polymer solution.

* * * * *